(12) United States Patent
Zhong et al.

(10) Patent No.: US 8,652,884 B2
(45) Date of Patent: Feb. 18, 2014

(54) SEMICONDUCTOR DEVICE STRUCTURE AND METHOD FOR MANUFACTURING THE SAME

(75) Inventors: Huicai Zhong, San Jose, CA (US); Qingqing Liang, Lagrangeville, NY (US)

(73) Assignee: The Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/380,975

(22) PCT Filed: Feb. 27, 2011

(86) PCT No.: PCT/CN2011/071354
§ 371 (c)(1),
(2), (4) Date: Dec. 27, 2011

(87) PCT Pub. No.: WO2012/006881
PCT Pub. Date: Jan. 19, 2012

(65) Prior Publication Data
US 2012/0187497 A1    Jul. 26, 2012

(30) Foreign Application Priority Data
Jul. 13, 2010    (CN) .............................. 2010 1 023077

(51) Int. Cl.
*H01L 21/335* (2006.01)
*H01L 21/70* (2006.01)
(52) U.S. Cl.
USPC 438/142; 257/499; 257/E21.54; 257/E47.001
(58) Field of Classification Search
None
See application file for complete search history.

(56) References Cited

U.S. PATENT DOCUMENTS

| 6,133,098 A | 10/2000 | Ogura et al. |
|---|---|---|
| 2002/0030223 A1 | 3/2002 | Narita et al. |
| 2002/0058372 A1 | 5/2002 | Jang et al. |
| 2010/0052018 A1* | 3/2010 | Cohen et al. .................. 257/288 |
| 2012/0049288 A1* | 3/2012 | Maruyama et al. ........... 257/369 |
| 2013/0015529 A1* | 1/2013 | Zhong et al. .................. 257/369 |

FOREIGN PATENT DOCUMENTS

| CN | 1333565 | | 1/2002 | |
|---|---|---|---|---|
| CN | 101577244 | | 11/2009 | |
| CN | 102347277 | * | 2/2012 | .......... H01L 21/8234 |
| JP | 2002-026309 | | 1/2002 | |

* cited by examiner

*Primary Examiner* — Zandra Smith
*Assistant Examiner* — Pamela E Perkins
(74) *Attorney, Agent, or Firm* — Morgan, Lewis & Bockius LLP

(57) ABSTRACT

The present invention proposes a semiconductor device structure and a method for manufacturing the same, and relates to the semiconductor manufacturing industry. The method comprises: providing a semiconductor substrate; forming gate electrode lines on the semiconductor substrate; forming sidewall spacers on both sides of the gate electrode lines; forming source/drain regions on the semiconductor substrates at both sides of the gate electrode lines; forming contact holes on the gate electrode lines or on the source/drain regions; and cutting off the gate electrode lines to form electrically isolated gate electrodes after formation of the sidewall spacers but before completion of FEOL process for a semiconductor device structure. The embodiments of the present invention are applicable for manufacturing integrated circuits.

10 Claims, 6 Drawing Sheets

US 8,652,884 B2

SEMICONDUCTOR DEVICE STRUCTURE AND METHOD FOR MANUFACTURING THE SAME

CROSS REFERENCE TO RELATED APPLICATION

This application is a National Phase application of, and claims priority to, PCT Application No. PCT/CN2011/071354, filed on Feb. 27, 2011, entitled "SEMICONDUCTOR DEVICE STRUCTURE AND METHOD FOR MANUFACTURING THE SAME", which claimed priority to Chinese Application No. 201010230771.1, filed on Jul. 13, 2010. Both the PCT Application and Chinese Application are incorporated herein by reference in their entireties.

BACKGROUND OF THE INVENTION

With development in the semiconductor technologies, sizes of semiconductor devices are continually scaling down, while integration level of integrated circuits becomes more and more intensive, thus the process for manufacturing semiconductor device structures faces increasingly strict requirements. In the formation process of gate electrodes, as the pitch between devices becomes increasingly narrow, particularly in the 45 nm or below technology, the process for etching gate electrodes already stands out to be a significant issue which requires semiconductor manufacturing industry to make common effort.

In the prior art, gate electrodes are usually etched by means of a double-mask lithography technology. FIG. 1a and FIG. 1b illustrate a method in the prior art for forming gate electrodes. In the figures, 100 denotes an active region formed on a semiconductor substrate. Specifically, it is preferred to form a gate electrode material layer over the whole semiconductor substrate on which the active region has already been formed and other necessary processes have been performed, then to coat the gate electrode material layer with photo-resist, to pattern the photo-resist into the shape of gate electrode lines to be formed, and then to etch the gate electrode material layer with the patterned photo-resist serving as a mask so as to form gate electrode lines 200 shown in FIG. 1a, and then to perform lithography with use of a second mask plate so as to form gate electrode line cuts 300 shown in FIG. 1b by etching. In subsequent processes, it is necessary to form sidewall spacers outside the gate electrodes, by which the gate electrode line cuts 300 are completely filled by the insulating material of the sidewall spacers, so that the gate electrodes are electrically isolated.

However, in aforesaid process, the cuts formed between the gate electrodes at the second-time lithography and etching are very small, making them hard to be filled with an insulating material when sidewall spacers are formed, which consequently is prone to cause a short circuit between gate electrodes in subsequent processes (e.g. such as ion implantation).

Additionally, since aforesaid lithography technology requires extremely high preciseness, Optical Proximity Correction (OPC) becomes very difficult. In the process of 45 nm or below, this method cannot satisfy the requirements of preciseness in gate mask imaging and etching.

Therefore, it is necessary to propose a more advanced gate electrode formation technology to solve abovementioned problems.

SUMMARY OF THE INVENTION

The present invention is intended to at least solve the abovementioned technical problems, and particularly, to propose a semiconductor device structure with gate electrode line cuts of high preciseness and a method for manufacturing the same.

In order to achieve aforesaid objectives, in one aspect, the present invention provides a method for manufacturing a semiconductor device structure, which comprises following steps: providing a semiconductor substrate; forming gate electrode lines on the semiconductor substrate; forming sidewall spacers on both sides of the gate electrode lines; forming source/drain regions on the semiconductor substrates at both sides of respective gate electrode lines; forming contact holes on the gate electrode lines or on the source/drain regions; and cutting off the gate electrode lines to form electrically isolated gate electrodes after formation of the sidewall spacers and before completion of a Front End of Line (FEOL) process for a semiconductor device structure.

Preferably, cutting off the gate electrode lines may comprise: cutting off the gate electrode lines by means of Reactive Ion Etching or laser cut etching.

Preferably, if shallow trench isolations are formed on the semiconductor substrate, then the gate electrode lines are cut off at positions over the shallow trench isolations.

For an embodiment of the present invention, the preferred time for cutting gate electrode lines is prior to formation of an interlayer dielectric layer on the semiconductor substrate. In this embodiment, contact holes are formed after cutting the gate electrode lines, and the specific steps may include: forming an interlayer dielectric layer over the whole semiconductor device structure, wherein, the interlayer dielectric layer fills the space between the isolated gate electrodes; then etching the interlayer dielectric layer to form contact holes on the gate electrodes or on the source/drain regions.

In another embodiment of the present invention, a method for forming upper, lower contact holes respectively may be adopted, which comprises: forming a first interlayer dielectric layer first; etching the first interlayer dielectric layer to form lower contact holes on source/drain regions; then forming a second interlayer dielectric layer; etching the second interlayer dielectric layer to form upper contact holes on the gate electrode lines or on the source/drain regions; wherein, the upper contact holes and the lower contact holes on the source/drain regions are aligned so as to form complete contact holes. The gate electrode lines are cut off after formation of the lower contact holes.

In an embodiment of the present invention, after formation of source/drain regions, the method further comprises performing the gate replacement flow, which comprises: removing gate electrode lines to form openings at inner walls of sidewall spacers, and then forming replacement gate electrode lines in the openings.

Alternatively, in another embodiment of the present invention, gate electrode lines are cut off immediately after formation of sidewall spacers so as to form isolated gate electrodes; and this method may also comprise performing the replacement gate flow, which comprises: after formation of source/drain regions, removing gate electrodes to form openings at inner walls of sidewall spacers, and forming replacement gate electrodes in the openings.

In another aspect, the present invention provides a semiconductor device structure, comprising: a semiconductor substrate; at least two gate electrodes formed on the semiconductor substrate and arranged along the gate width direction; sidewall spacers formed only at both sides of the gate electrodes, and in the gate width direction, end portions of the sidewall spacers are flushed with end portions of the gate electrodes; source/drain regions formed on the semiconductor substrate and positioned at both sides of gate electrodes;

wherein, in the gate width direction, a dielectric material is filled between neighboring gate electrodes so as to form electrical isolations between the gate electrodes.

Preferably, the distance between neighboring gate electrodes is about 1-10 nm in the direction parallel to the gate width.

Preferably, in case that the material of sidewall spacers is same as the dielectric material, the semiconductor device structure further comprises: an interfacial layer formed between the dielectric material and the sidewall spacers.

For example, the material of sidewall spacers and the dielectric material may include nitride, oxide or carbon oxide, and the interfacial layer may include $SiO_2$.

Preferably, the thickness of the interfacial layer is smaller than or equal to 1 nm. Preferably, in case that the material of sidewall spacers is different from the dielectric material, the dielectric material may include one of $SiO_2$, SiOF, SiCOH, SiO, SiCO, SiCON, SiON, PSG, and BPSG, or any combination thereof.

The embodiments of the present invention describe the semiconductor device structure and its manufacturing method; namely, instead of cutting through gate electrode lines immediately after formation of the gate electrode lines by lithography so as to isolate the gate electrodes, the gate electrode lines are cut off after formation of sidewall spacers of the gate electrode lines and before completion of FEOL process of a semiconductor device structure, so as to form electrically isolated gate electrode line cuts. A semiconductor device structure manufactured according to aforesaid method exhibits gate electrode cuts whose preciseness is significantly improved and optimized sectional shapes of sidewall spacers of the gate electrodes. Since the gate electrode lines are cut off in a process following formation of sidewall spacers, thus occurrence of a short circuit between gate electrodes shall be avoided to a far extent in subsequent processes, and the cuts also can be smaller. In the embodiments of the present invention, the gate electrode lines may be cut by means of Reactive Ion Etching or laser cut etching, thus the high demanding OPC is not necessary and the process simplified.

Additional aspects and advantages of the present invention will be provided in the following description, and some will become more apparent from following description or be appreciated according to the application of the present invention.

BRIEF DESCRIPTION OF THE DRAWINGS

The foregoing and/or additional aspects and advantages of the present invention will become more evident and easily comprehensible according to the below disclosure of various embodiments with reference to the accompanied drawings which of course are illustrative and thus are not drawn to scale, wherein:

FIGS. 2-10b illustrate cross-sectional views or plan views of structures corresponding to respective steps of a method for manufacturing a semiconductor device structure according to an embodiment of the present invention;

DETAILED DESCRIPTION OF THE INVENTION

Figure 1A:
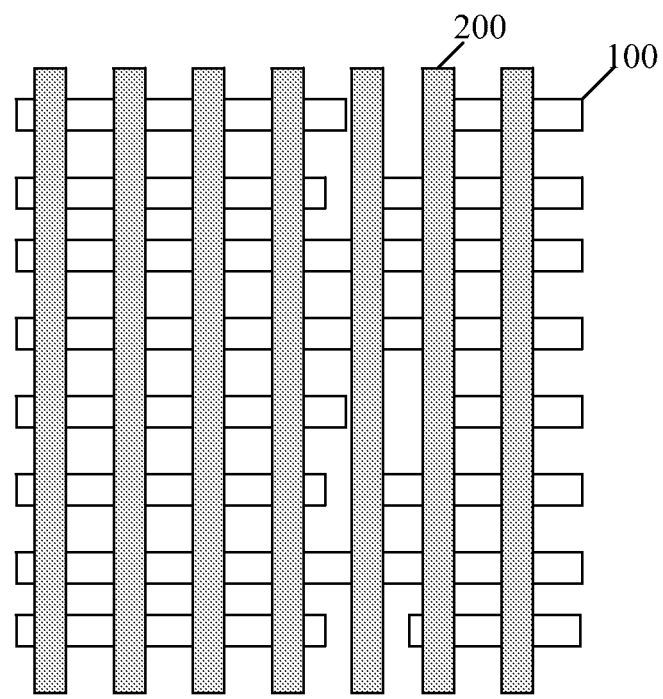
FIGS. 1a, 1b are illustrations of a method for etching a gate electrode in the prior art.

Described below in detail are various embodiments of the present invention, whose examples also are illustrated in the drawings, wherein same or similar numbers throughout the drawings denote same or similar elements or elements have the same or similar functions. The embodiments described below with reference to the accompanied drawings are merely illustrative, and are provided for explaining the present invention only, thus should not be interpreted as a limit to the present invention.

The following disclosure provides a plurality of different embodiments or examples to achieve different structures of the present invention. To simplify the disclosure of the present invention, description of the components and arrangements of specific examples is given. Of course, they are only illustrative and not limiting the present invention. Moreover, in the present invention, reference number(s) and/or letter(s) may be repeated in different embodiments. Such repetition is for the purposes of simplification and clearness, and does not denote the relationship between the respective embodiments and/or arrangements being discussed. In addition, the present invention provides various examples for specific processes and materials. However, it is obvious for a person of ordinary skill in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

FIGS. 2-10b illustrate cross-sectional views or plan views of structures corresponding to respective steps of a method for manufacturing a semiconductor device structure according to an embodiment of the present invention. The method for manufacturing a semiconductor device structure according to the embodiment of the present invention and the semiconductor device structures obtained therefrom are describe below with reference to FIGS. 2-10b.

Figure 2:
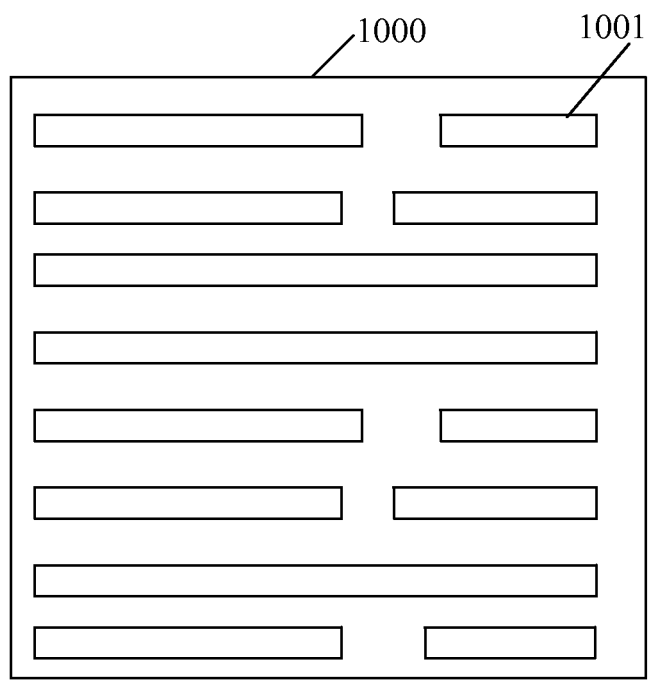

First, as shown in FIG. 2, a semiconductor substrate 1000 is provided. The semiconductor substrate 1000 may comprise any semiconductor substrate material as appropriate, which specifically may be, but not limited to, Si, Ge, GeSi, SOI (silicon on insulator), SiC, GaAs, or any III/V-group compound semiconductor. According to the design specifications known in the prior art (for example, a p-type substrate or an n-type substrate), the semiconductor substrate 1000 may be of various doping configurations. Additionally, the semiconductor substrate 1000 may optionally include an epitaxial layer, and may be stressed to enhance performance.

As shown in FIG. 2, it is assumed that an active region 1001 has already been formed on the semiconductor substrate 1000.

Figure 3:
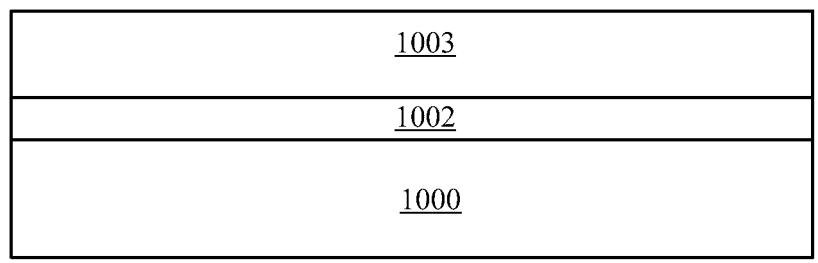

As shown in FIG. 3, a gate dielectric layer 1002 may be deposited over the semiconductor substrate 1000, and the gate dielectric layer 1002 may be consisted of normal $SiO_2$, or a high-k gate dielectric material, for example, one of $HfO_2$, HfSiO, HfSiON, HfTaO, HfTiO, HfZrO, $Al_2O_3$, $La_2O_3$, $ZrO_2$, and LaAlO, or any combination thereof, and it may be selected in view of needs in practice.

As shown in FIG. 3, a gate electrode material layer 1003 is formed on the gate dielectric layer 1002 next, and it may be formed by means of a conventional conductive material deposition method, for example, Physical Vapor Deposition (PVD, which includes evaporation, sputtering, electron beam, etc.), Chemical Vapor Deposition (CVD), electroplating or any appropriate method. The gate electrode material layer 1003 may be a single layer of polysilicon, or may be composed by a lower layer of a metal material and an upper layer of a polysilicon material. The metal material may be Ti, Co, Ni, Al, W or an alloy thereof, etc. For the present invention, its implementation shall not be affected by the composition of the gate electrode material.

Next, photo-resist is coated over the gate electrode material layer 1003, and then photo-resist is patterned according to the pattern of gate electrode lines to be formed. The gate electrode material layer 1003 is etched with the patterned photo-resist serving as a mask so as to form gate electrode lines 1004 shown in FIG. 4. Then photo-resist remaining on the gate electrode lines 1004 is further removed.

Figure 1B:
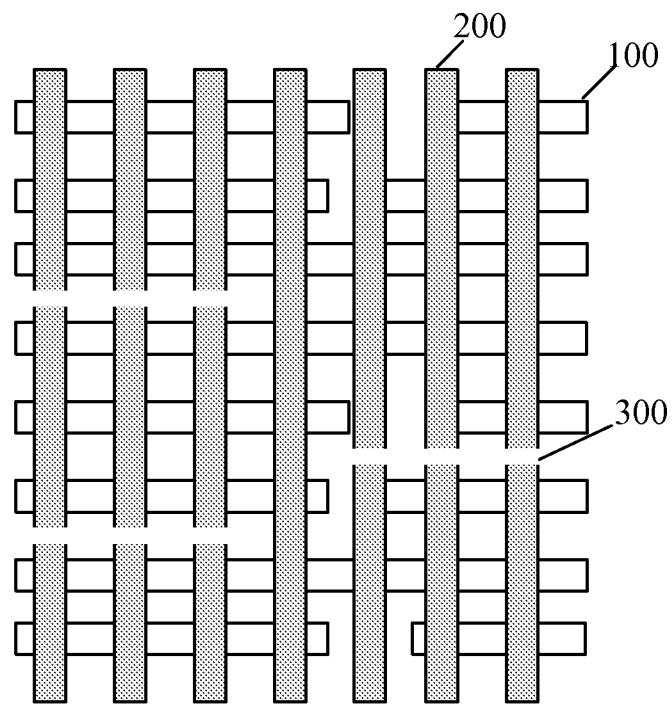

In conventional methods, the gate electrode lines have to be further etched transversely as shown in FIG. 1b at this stage; however, this is not necessary in embodiments of the present invention.

Next, light doping is performed at both sides of respective gate electrode lines to form source/drain extension regions, or halo implant is further performed to form Halo regions. Since these processes are conventional technologies, thus they are not shown in the drawings for clearness.

Figure 5:
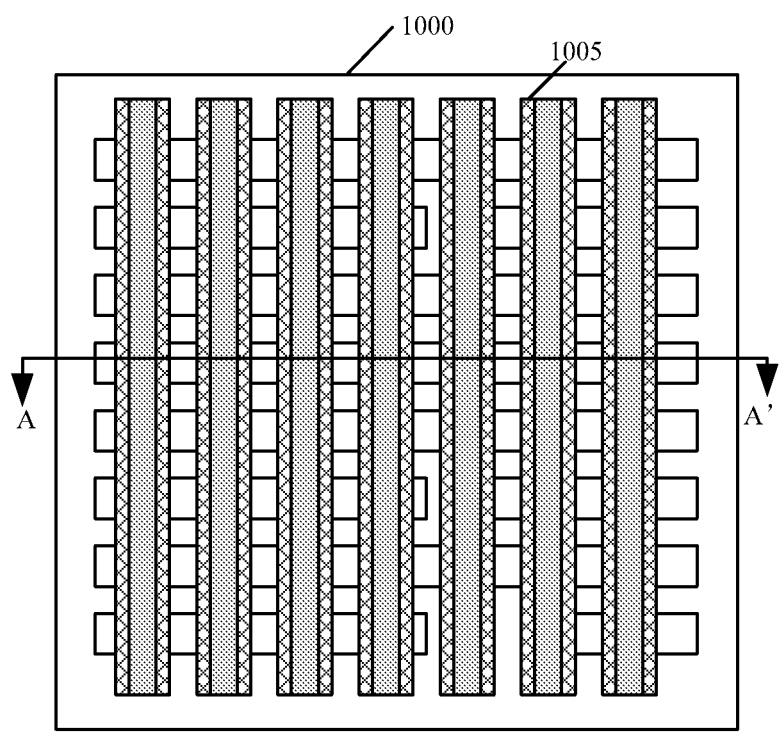

Then, as shown in FIG. 5, sidewall spacers 1005 are formed at both sides of the gate electrode lines 1004. A specific method may be to deposit a layer of $Si_3N_4$ of about 10-40 nm thickness over the whole semiconductor device structure, then to etch the $Si_3N_4$ by means of Reactive Ion Etching (RIE) till the sidewall spacers 1005 are formed. The shape of the sidewall spacers finally resulted from etching may be different from those shown in FIG. 5 and FIG. 6, and the shapes in the accompanied drawings are exemplary only. The materials for the sidewall spacers may further be $SiO_2$, SiON or the like, or other low-k dielectric materials, which may be materials such as: SiOF, SiCOH, SiO, SiCO, or SiCON. The sidewall spacers may be formed by more than one layer.

Next, heavy doping is made at both sides of the gate electrode lines and then rapid annealing is performed to activate the impurity to form source/drain regions 1007.

Figure 6:
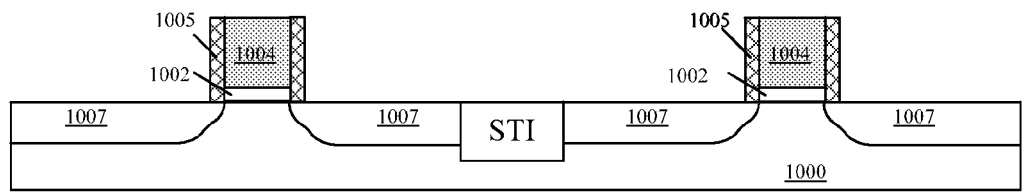

FIG. 6 illustrates a cross-sectional view made in AA' direction shown in FIG. 5.

For the purpose of reducing contact resistance, metal silicide may be formed on the gate electrode lines 1004 and source/drain regions 1007. Specifically, a layer of metal, for example, Ni, Cu or W is deposited first over the whole semiconductor device structure, then annealing is performed to form metal silicide which has not been illustrated in the accompanied drawings.

Figure 7:
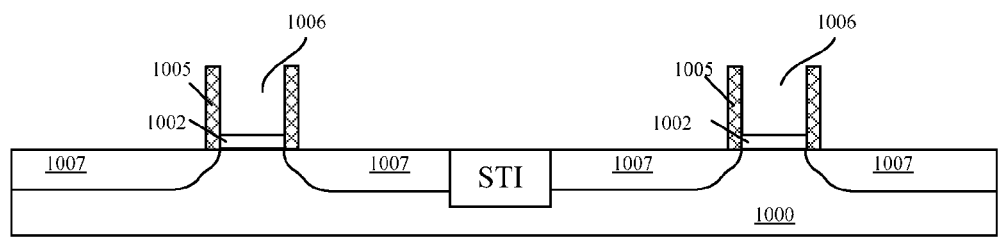

In embodiments of the present invention, replacement gate process flow may be performed at this stage. Namely, as shown in FIG. 7, gate electrode lines 1004 may be removed to form openings 1008 between inner walls of the sidewall spacers 1005, then gate electrode metal may be deposited in the openings 1008. Alternatively, the gate dielectric layers 1002 may be further removed, and then a layer of replacement gate dielectric layer and a replacement gate electrode metal may be deposited.

Figure 8:
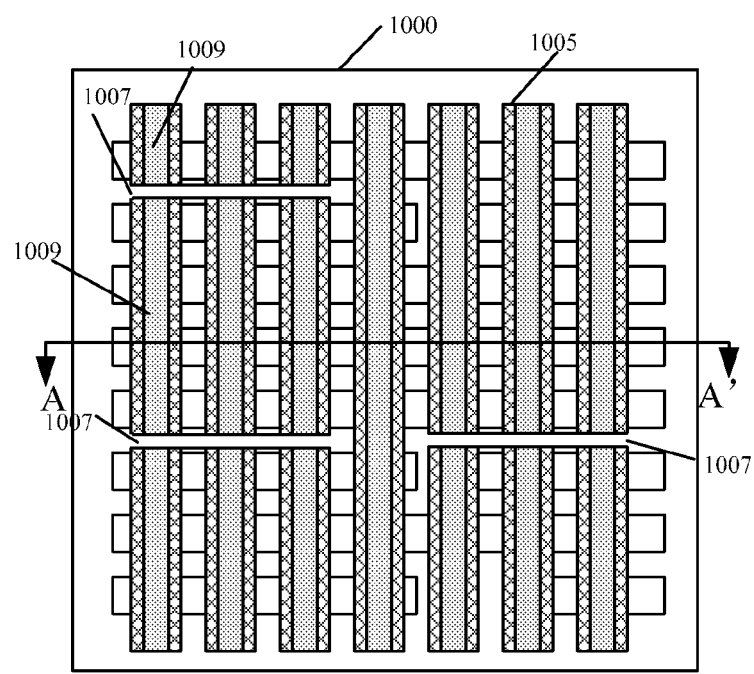

Preferably, the gate electrode lines 1004 are cut off after formation of the metal silicide. Cutting methods include cutting the gate electrode lines 1004 by means of RIE or laser cut etching so as to form isolations between the gate electrode lines. As shown in FIG. 8, parallel cuts 1007 may be formed on the gate electrode lines 1004 now. The width of the parallel cuts may be about 1-10 nm, and may also be determined according to requirements in practice. In order not to obscure the reading, FIG. 8 illustrates three cuts only; however, in practice, etching may be performed according to practical needs so as to form desired number of cuts. Ascribing to the cutting, electrically isolated gate electrodes 1009 are formed.

Preferably, cutting position is situated over Shallow Trench Isolation (STI) on the semiconductor substrate, and the cutting is made downward till the top of the Shallow Trench Isolation.

Optionally, for some embodiments of the present invention, the gate electrode lines may be cut off before formation of the metal silicide. And metal silicide is formed after the cutting. Since the cutting position is situated over STI, thus the deposited metal shall not react with the oxide in the STI situated below, and thus the metal may be removed selectively in subsequent processes.

Figure 4:
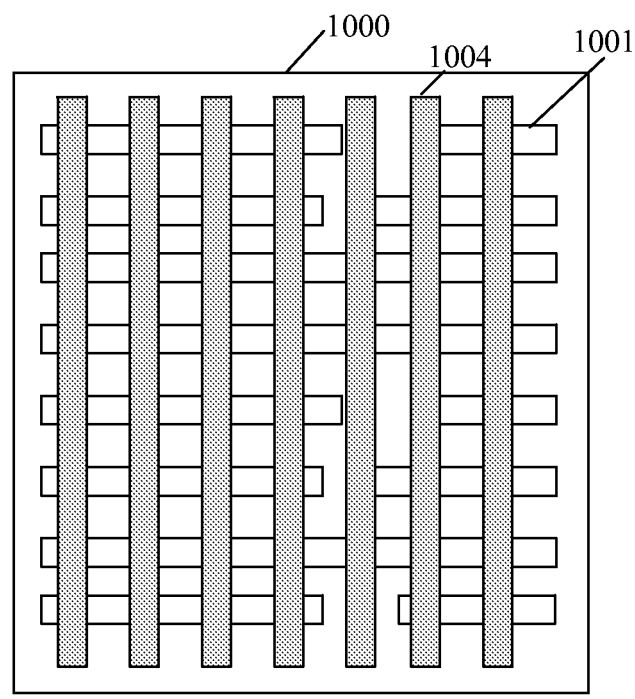

In conventional processes, no gate electrode line is cut until the gate electrode lines as shown in FIG. 4 are formed. However, in other subsequent processes, for example, in formation of sidewall spacers, since the cuts are very small, it is quite difficult to fill insulating materials of the sidewall spacers therein, which consequently is prone to cause a short circuit between gate electrodes in other subsequent processes. For example, a short circuit shall probably occur between the gate electrodes in the event of performing ion implant at source/drain regions or forming metal silicide. In the present invention, the gate electrode lines are cut off after formation of a metal silicide, and an insulating dielectric is filled in subsequent processes, which is able to effectively prevent occurrence of a short circuit between neighboring gate electrodes. Even if the cuts are made very small, it is still sufficient to meet the requirements of effectively isolating the gate electrodes electrically. Thus, this method simplifies the processes because it do not need any mask of high preciseness and OPC requirement.

Next, an interlayer dielectric layer (ILD) is deposited over the whole semiconductor substrate, and the material for the interlayer dielectric layer may include: one of $SiO_2$, $Si_3N_4$, SiOF, SiCOH, SiO, SiCO, SiCON, SiON, PSG, and BPSG, or any combination thereof.

Figure 9:
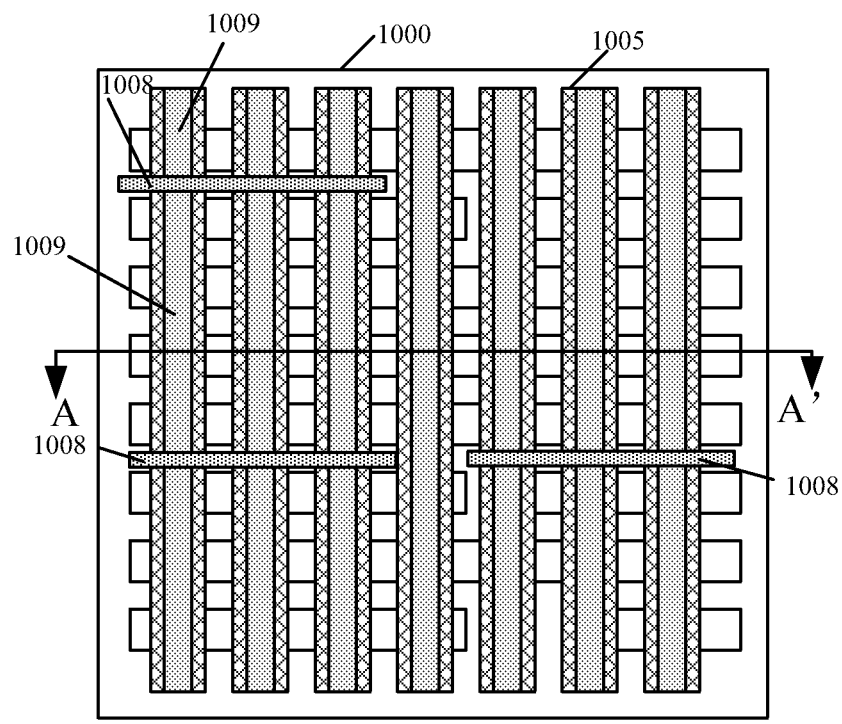
Figure 10:
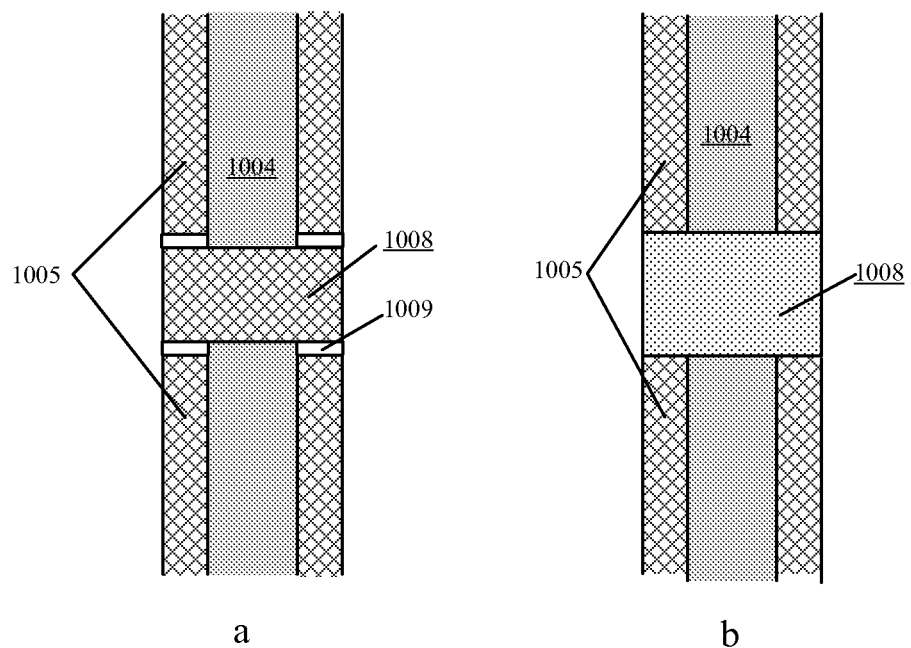

As shown in FIG. 9, the dielectric material 1008 for forming the interlayer dielectric layer also fills the parallel cuts 1007 while covering the whole semiconductor device structure, such that the gate electrodes 1009 are isolated.

FIGS. 10a, 10b are enlarged diagrams of a contact interface between sidewall spacers and the dielectric material shown in FIG. 9. As shown in FIG. 10a, if the material of the sidewall spacers 1005 is same as the dielectric material 1008 to be filled then, an interfacial layer 1010 shall be formed between the dielectric material 1008 and the gate electrode line 1004 and its sidewall spacers 1005 during the process. For example, the material of the sidewall spacers is $Si_3N_4$, and the dielectric material also is $Si_3N_4$, thence an interfacial layer 1010 shall be formed between the dielectric material and the sidewall spacers, and the interfacial layer 1010 is $SiO_2$ in this case.

Then, contact holes are formed within the interlayer dielectric layer, and then contact vias are formed in the contact holes so as to complete the FEOL manufacturing process of a semiconductor device structure.

To this extent, the semiconductor device structure formed according to the present embodiment of the present invention is finished. As shown in FIG. 9, the semiconductor device structure comprises: a semiconductor substrate 1000; at least two gate electrodes 1009 formed on the semiconductor substrate 1000 and arranged along the gate width direction; sidewall spacers 1005 formed only at both sides of the gate electrodes 1009, and in the gate width direction, end portions of the sidewall spacers 1005 are flushed with end portions of the gate electrodes 1009; source/drain regions formed on the semiconductor substrate 1000 and positioned at both sides of gate electrodes 1009; wherein, in the gate width direction, a dielectric material 1008 is filled between neighboring gate electrodes 1009 so as to form electrical isolations between the gate electrodes 1009.

Preferably, the distance between neighboring gate electrodes is about 1-10 nm in the direction parallel to the gate width.

In the foregoing description, the direction along AA' in FIG. 9 denotes the direction parallel to the gate length, while the direction vertical to AA' denotes the direction parallel to the gate width.

As shown in FIG. 10a, preferably, in case that the material of the sidewall spacers 1005 is same as the dielectric material 1008, the semiconductor device structure further comprises: an interfacial layer 1010 formed between the dielectric material 1008 and the sidewall spacers 1005. For example, the material of sidewall spacers 1005 and the dielectric material 1008 may include nitride, oxide or carbon oxide, and the interfacial layer may include $SiO_2$.

Preferably, the thickness of the interfacial layer is smaller than or equal to 1 nm.

Preferably, in case that the material of sidewall spacers 1005 is different from the dielectric material 1008, an interfacial is formed between the dielectric material 1008 and the gate electrode and its sidewall spacers 1005, as shown in FIG. 10b. The dielectric material may include one of $SiO_2$, SiOF, SiCOH, SiO, SiCO, SiCON, SiON, PSG, and BPSG, or any combination thereof.

In the semiconductor device structure provided in embodiments of the present invention, parallel cuts locate between the gate electrodes in the direction parallel to the gate width, and a dielectric material is filled between the cuts, which thus isolate the gate electrodes effectively and thus result in better performance.

The method for cutting through gate electrode lines applied in embodiments of the present invention is able to significantly reduce the proximity effect which makes lithography, etching or OPC complicated, such that it becomes easier to etch gate electrodes and also easier to control the width of the gate electrodes. As for the standard of semiconductor processing flow, the method applied in embodiments of the present invention simplifies the design standard and thus is able to reduce chip size further.

Embodiments of the present invention also are favorable in the high-k metal gate process of 45 nm or below. The method for cutting through gate electrode lines in embodiments of the present invention also may be effectively applied to pattern an active area.

Figure 11:
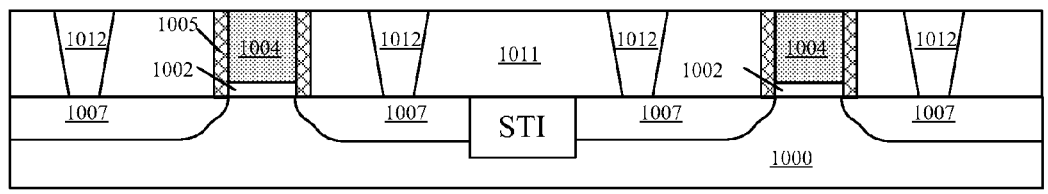
FIGS. 11-12 illustrate cross-sectional views of structures corresponding to respective steps of another method for manufacturing a semiconductor device structure according to another embodiment of the present invention.
Figure 12:
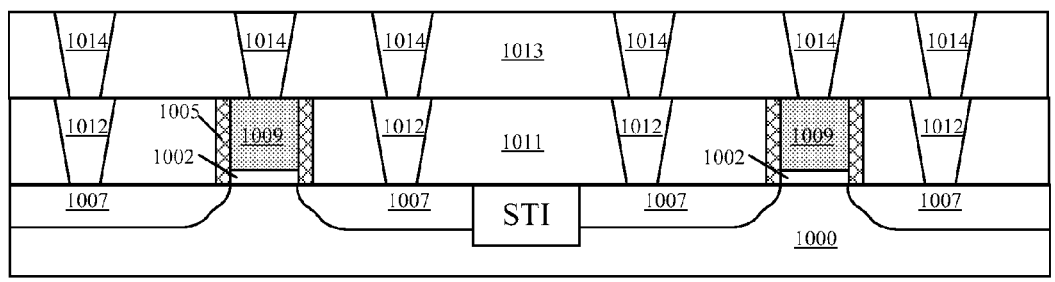

FIGS. 11-12 illustrate cross-sectional views of the structures corresponding to respective steps of another method for manufacturing a semiconductor device structure according to another embodiment of the present invention. After formation of a structure shown in FIG. 6, or after implementation of gate replacement flow, contact holes are formed by way of forming upper contact holes and lower contact holes respectively, and then gate electrode lines are cut off after formation of lower contact holes. The specific steps for forming a semiconductor device structure according to the embodiment of the present invention is to be described in detail with reference to FIGS. 11-12.

As shown in FIG. 11, an interlayer dielectric layer 1011 is deposited over a whole semiconductor device structure; optionally, the interlayer dielectric layer 1011 may be polished uniformly to expose the top surfaces of gate electrode lines 1004, for example, Chemical Mechanical Polish (CMP) may be applied here. Next, lower contact holes 1012 are formed on the interlayer dielectric layer 1011, and a conductive material such as W or the like is filled therein. Then, the whole semiconductor device structure is polished till the top surfaces of the gate electrode lines 1004 are exposed.

Here, as shown in FIG. 8, the gate electrode lines 1004 are cut off to form gate electrodes 1009 and parallel cuts 1007 which electrically isolate the gate electrodes 1009.

As shown in FIG. 12, an interlayer dielectric layer 1003 is further deposited over the whole semiconductor device structure, and in this case, the dielectric material of the interlayer dielectric layer is able to fill the parallel cuts 1007. Then, the interlayer dielectric layer 1013 is etched so as to form upper contact holes 1014 on the gate electrodes 1009 and on the lower contact holes 1012.

Noticeably, embodiments of the present invention are compatible with replacement gate technology, and also are compliable with double contact holes formation method. And the double contact holes formation method is able to effectively prevent occurrence of a short circuit between gate electrodes and to improve both quality and performance of a semiconductor device structure.

Although embodiments of the present invention have already been illustrated and described, it is readily apparent to those having ordinary skill in the art that the applications of the present invention shall not be limited to the process, mechanism, manufacture, material composition, means, methods and steps described in the specific embodiments in the specification. A person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes those process, mechanism, manufacture, material composition, means, methods or steps.

What is claimed is:

1. A method for manufacturing a semiconductor device structure, comprising:
    providing a semiconductor substrate;
    forming gate electrode lines on the semiconductor substrate;
    forming sidewall spacers on both sides of the gate electrode lines;
    forming source/drain regions on the semiconductor substrates at both sides of the gate electrode lines;
    forming contact holes on the gate electrode lines or on the source/drain regions; and
    cutting off the gate electrode lines and the sidewall spacers to form electrically isolated gate electrodes after formation of the sidewall spacers and before completion of a FEOL process for the semiconductor device structure.

2. The method according to claim 1, wherein cutting off the gate electrode lines comprises: cutting off the gate electrode lines by means of Reactive Ion Etching or laser cut etching.

3. The method according to claim 1, wherein if shallow trench isolations are formed on the semiconductor substrate, the gate electrode lines are cut off at positions over the shallow trench isolations.

4. The method according to claim 1, wherein the distance between neighboring isolated gate electrodes is about 1-10 nm.

5. The method according to claim 1, wherein the gate electrode lines are cut off before formation of an interlayer dielectric layer on the semiconductor substrate so as to form electrically isolated gate electrodes.

6. The method according to claim 5, wherein formation of the contact holes comprises:
- forming an interlayer dielectric layer on the semiconductor substrate, wherein the interlayer dielectric layer is filled between the isolated gate electrodes; and
- etching the interlayer dielectric layer to form the contact holes on the gate electrodes or on the source/drain regions.

7. The method according to claim 1, wherein formation of the contact holes comprises:
- forming a first interlayer dielectric layer;
- etching the first interlayer dielectric layer to form lower contact holes on the source/drain regions;
- forming a second interlayer dielectric layer; and
- etching the second interlayer dielectric layer to form upper contact holes on the gate electrode lines or on the source/drain regions,
- wherein the lower contact holes and the upper contact holes are aligned on the source/drain regions.

8. The method according to claim 7, wherein the gate electrode lines are cut off after formation of the lower contact holes.

9. The method according to claim 1, wherein after formation of the source/drain regions, the method further comprises:
- removing the gate electrode lines to form openings at inner walls of the sidewall spacers; and
- forming replacement gate electrode lines in the openings.

10. The method according to claim 1, wherein after formation of the sidewall spacers, the gate electrode lines are cut off to form electrically isolated gate electrodes;

the method further comprises:
- removing the gate electrodes to form openings at inner walls of the sidewall spacers; and
- forming replacement gate electrodes in the openings.

* * * * *